United States Patent
Picard et al.

(10) Patent No.: US 10,921,355 B2
(45) Date of Patent: Feb. 16, 2021

(54) METHOD AND SYSTEM FOR DETECTING USEFUL SIGNALS, WITH RESPECTIVE NON-NEGLIGIBLE FREQUENCY DRIFT, IN A TOTAL SIGNAL

(71) Applicant: AIRBUS DEFENCE AND SPACE SAS, Toulouse (FR)

(72) Inventors: Mathieu Picard, Toulouse (FR); Mehdi Anteur, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 853 days.

(21) Appl. No.: 15/549,199

(22) PCT Filed: Feb. 12, 2016

(86) PCT No.: PCT/FR2016/050323
§ 371 (c)(1),
(2) Date: Jan. 13, 2018

(87) PCT Pub. No.: WO2016/132050
PCT Pub. Date: Aug. 25, 2016

(65) Prior Publication Data
US 2018/0120366 A1   May 3, 2018

(30) Foreign Application Priority Data
Feb. 18, 2015   (FR) ...................................... 1551360

(51) Int. Cl.
*G01R 23/167*   (2006.01)
*G01R 23/18*   (2006.01)

(52) U.S. Cl.
CPC ........... *G01R 23/167* (2013.01); *G01R 23/18* (2013.01)

(58) Field of Classification Search
CPC ...... G01R 23/167; G01R 23/18; G01S 13/782
See application file for complete search history.

(56) References Cited

U.S. PATENT DOCUMENTS

| 7,787,846 B1 | 8/2010 | Page et al. |
| 2010/0310009 A1* | 12/2010 | Lakkis ............... H04L 27/2003 375/308 |
| 2015/0155960 A1 | 6/2015 | Artigue |

FOREIGN PATENT DOCUMENTS

WO   2014/006351 A1   1/2014

* cited by examiner

*Primary Examiner* — Sibin Chen
(74) *Attorney, Agent, or Firm* — Im IP Law; Chai Im; C. Andrew Im

(57) ABSTRACT

A method for detecting a plurality of useful signals in a total signal. The useful signals correspond to radiofrequency signals emitted by different terminals in a multiplexing frequency band. A plurality of spectrograms calculated that have a compensated linear frequency drift and are respectively associated with different linear frequency drift values. For each analysis frequency and each spectrogram, time envelope filtering of the values is performed at the different times for analyzing the spectrogram at the analysis frequency using a filter representing a reference time envelope of the useful signals. A useful signal is detected at an analysis time and at an analysis frequency in response to a verification of a predefined detection criterion by the value from a spectrogram resulting from filtering at the analysis time and at the analysis frequency.

19 Claims, 3 Drawing Sheets

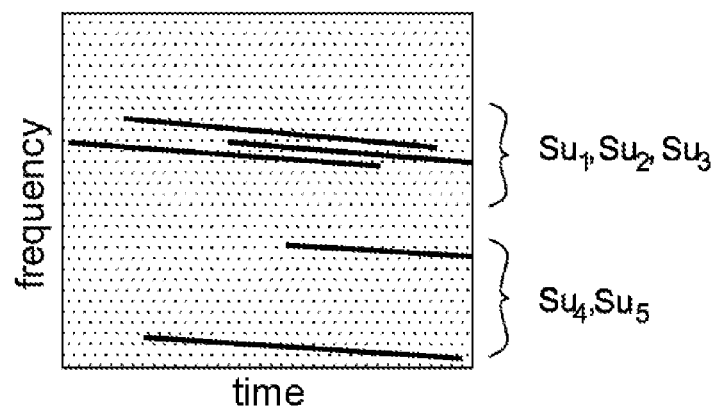
Fig. 3A S[1]
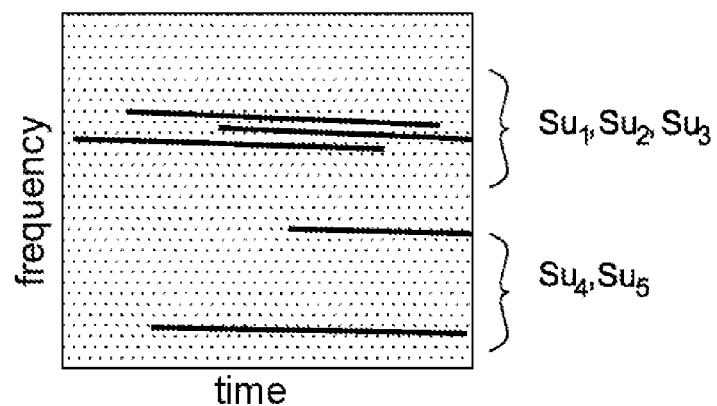
Fig. 3B S[2]
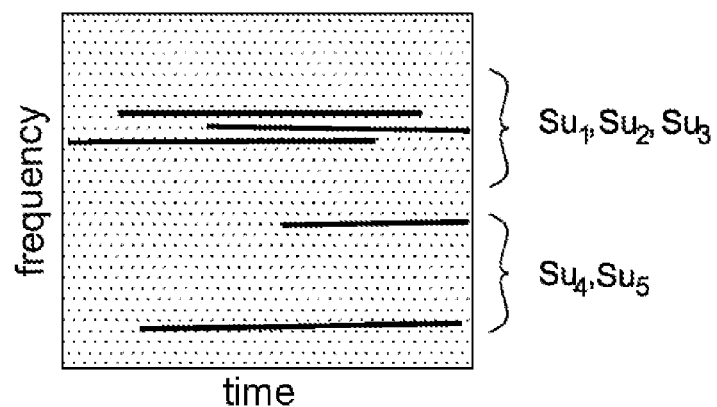
Fig. 3C S[3]

METHOD AND SYSTEM FOR DETECTING USEFUL SIGNALS, WITH RESPECTIVE NON-NEGLIGIBLE FREQUENCY DRIFT, IN A TOTAL SIGNAL

RELATED APPLICATIONS

This application is a § 371 application from PCT/FR2016/050323 filed Feb. 12, 2016, which claims priority from French Patent Application No. 15 51360 filed Feb. 18, 2015, each of which is herein incorporated by reference in its entirety.

TECHNICAL FIELD

The present invention belongs to the field of the detection of useful signals transmitted by various terminals. More particularly, the present invention relates to the detection of useful signals in the case of each useful signal having a finite duration and potentially being subject to a frequency drift that is greater, over the duration of said useful signal, than a spectral width of said useful signal.

The term "spectral width" of the useful signal is understood to mean the width of the instantaneous frequency spectrum of the useful signal. The spectral width of said useful signal is therefore independent of the frequency drift.

BACKGROUND OF THE INVENTION

The present invention is particularly advantageously applicable, although in a non-limiting manner, to the case of useful signals referred to as "narrowband" useful signals, for which the spectral width is less than 1 kilohertz.

In the case of narrowband useful signals, numerous phenomena may introduce a frequency drift that is greater than the spectral width of said useful signals.

First, since the useful signals are received by a receiving station, relative movements of the terminals with respect to said receiving station may cause, due to Doppler effect, frequency drifts which may ultimately be non-negligible with respect to the spectral width of the useful signals if the relative movement speeds are substantial. Such frequency drifts may be introduced by mobility of the terminals and/or mobility of the receiving station.

In particular, in the case of a receiving station installed on board a satellite in a traveling orbit, for example a low Earth orbit (LEO), the speed of travel of said satellite with respect to the (fixed or mobile) terminals may introduce non-negligible frequency drifts of the useful signals received at said receiving station.

The frequency drift may also be introduced on transmission, in an uncontrolled manner. Specifically, the transmission of a useful signal requires a terminal to be provided with frequency synthesis means (local oscillator, mixer, etc.) implemented so as to frequentially transpose the useful signal, generated in baseband, toward a multiplexing frequency band of the useful signals. Such frequency synthesis means introduce a frequency drift which, in particular in the case of narrowband useful signals, may ultimately be non-negligible with respect to the spectral width of said useful signals, in particular in the case of low-cost terminals for which the frequency synthesis means are low performance (see for example international patent application WO 2014/006351 A1). However, the frequency drift introduced by the frequency synthesis means is negligible in comparison with that caused by the relative movements of the terminals with respect to the receiving station, in particular over a short period such as the duration of a message.

To a lesser extent, the frequency synthesis means of the receiving station may also introduce a frequency drift, but this is, at any given time, substantially the same for all of the useful signals.

In addition, certain useful signals may be transmitted intentionally with a frequency drift. This is in particular the case with chirps. In a manner known to a person skilled in the art, a chirp is a pseudo-periodic, continuous or discontinuous, signal, the frequency of which increases (or decreases) over time, generally in a substantially linear manner.

Thus, a distinction may be made between different types of frequency drift:
   frequency drifts resulting from the transmission of useful signals, whether intentional (for example a chirp) or unintentional (for example due to low-performance frequency synthesis means);
   frequency drifts that are independent of the transmission of useful signals, the effects of which are felt only at the receiving station (for example due to Doppler effect).

The detection of such signals is complex to achieve, especially since the frequency drift may vary from one useful signal to another. In addition, the initial frequency and the transmission time of each useful signal are not necessarily known, thereby making the detection of useful signals even more complex, since they must be detected blindly or almost blindly without a priori knowledge of the respective frequency drifts, the transmission times and the initial frequencies of said useful signals.

It is possible to implement estimators, in terms of maximum likelihood, by testing all potential possibilities. However, the number of calculations and the amount of data to be stored is then very substantial, and may ultimately be prohibitive in certain cases, in particular for the detection of useful signals on a satellite.

SUMMARY OF THE INVENTION

The object of the present invention is to overcome all or some of the limitations of the solutions of the prior art, in particular those presented above, by proposing a solution that makes it possible to detect useful signals in a total signal, said useful signals potentially being subject to frequency drifts having different respective values.

To this end, and according to a first aspect, the invention relates to a method for detecting a plurality of useful signals in a total signal, each useful signal being of finite duration and potentially being subject to a frequency drift that is greater, over the duration of said useful signal, than a spectral width of said useful signal, said useful signals corresponding to radiofrequency signals transmitted by various terminals in a multiplexing frequency band, said total signal corresponding to all of the radiofrequency signals received in the multiplexing frequency band. The method for detecting useful signals includes steps:
   calculating multiple spectrograms associated with various linear frequency drift values, respectively, each spectrogram being representative of the values of the frequency spectrum of the total signal at various analysis frequencies in the multiplexing frequency band, and of time variations of said values of the frequency spectrum at various analysis times within an analysis time window by compensating for the linear frequency drift under consideration;

for each analysis frequency and each spectrogram: time envelope filtering of the values at the various times of analysis of said spectrogram at said analysis frequency, by means of a filter representative of a reference time envelope of the useful signals, a useful signal being detected at an analysis time and an analysis frequency if a predefined detection criterion is verified by the value of a spectrogram obtained by filtering, referred to as a "filtered spectrogram", for said analysis time and said analysis frequency.

The present invention is therefore based on the calculation of spectrograms that are respectively associated with various linear frequency drift values, in which the linear frequency drift for each value under consideration has been compensated for.

Assuming that the frequency drifts to which the useful signals are subject are linear, i.e. of constant first derivative, the calculations to be carried out are made easier and are reduced. While this assumption may, in certain cases, indeed be verified for chirps, it nonetheless remains an approximation for the other types of useful signals. In addition, the complexity of the calculation may be adjusted by choosing a larger or smaller number of different values of the linear frequency drift, although detection is more robust and more accurate when this number is large.

A spectrogram obtained for a particular linear frequency drift value corresponds to a set of values of the frequency spectrum of the total signal, on which the linear frequency drift under consideration has been compensated for, which values are obtained for various analysis frequencies within the multiplexing frequency band and for various analysis times within the analysis time window. Again, in this case, calculation complexity may be adjusted by choosing a larger or smaller number of analysis frequencies and/or analysis times, within the limit however that the difference between the analysis frequencies is preferably equal to or smaller than the minimum spectral width of said useful signals, and that the difference between the analysis times is preferably equal to or smaller than the minimum duration of said useful signals.

A useful signal having a substantially linear frequency drift of value $\Delta F$ (expressed in hertz per second) will therefore have, in the spectrogram associated with the linear frequency drift of value $\Delta F$, a substantially constant center frequency. Thus, in each calculated spectrogram, detection advantageously consists in searching for useful signals without frequency drift.

The detection method also includes time envelope filtering of the various values of the spectrogram along the time axis. This step aims to improve, at each analysis time, the signal-to-noise ratio of a potential useful signal without frequency drift, taking into account a priori knowledge of the time envelope of the useful signals, for example of the duration of said useful signals or the minimum duration of the useful signals if they do not have the same duration and/or they are of variable duration.

In particular modes of implementation, the detection method may additionally include one or more of the following features considered individually or in any technically feasible combination.

In particular modes of implementation, the detection method includes, for each analysis time and each spectrogram, a step of filtering the frequency spectrum of the values at the various analysis frequencies of said spectrogram at said analysis time, by means of a filter representative of a reference frequency spectrum of the useful signals.

Such arrangements make it possible to improve, at each analysis frequency, the signal-to-noise ratio of a potential useful signal by taking into account a priori knowledge of the frequency spectrum of said useful signals, for example of the spectral width of said useful signals or the minimum spectral width of said useful signals if they do not have the same spectral width and/or they are of variable spectral width.

In particular modes of implementation, the time envelope filtering step and the frequency spectrum filtering step are executed together.

In particular modes of implementation, the detection method includes a step of searching for local maxima in a set with three dimensions that is made up of the values of the various filtered spectrograms, the detection criterion being evaluated for values corresponding to local maxima of said set.

In particular modes of implementation, the step of searching for local maxima includes:
  setting up a detection map associating, with each analysis frequency and each filtered spectrogram, the maximum value of said filtered spectrogram at said analysis frequency over the analysis times of the analysis time window;
  searching for local maxima on said detection map, the detection criterion being evaluated for values corresponding to local maxima on said detection map.

Such arrangements are advantageous in that they make it possible to decrease the calculation complexity associated with the search for local maxima.

In particular modes of implementation, the detection criterion is verified for a value of a filtered spectrogram if said value is higher than a predefined threshold value.

In particular modes of implementation, the detection criterion is verified for a value of a filtered spectrogram if said value is a maximum value over a predefined frequency detection window around the analysis frequency at which said value has been obtained.

In particular modes of implementation, the detection criterion is verified for a value of a filtered spectrogram if the analysis time at which said value has been obtained is located in a predefined central portion of the analysis time window.

In particular modes of implementation, the calculation of a spectrogram associated with a linear frequency drift value includes fractional Fourier transform calculations of successive blocks of the total signal, the angle of which corresponds to the linear frequency drift under consideration.

In particular modes of implementation, the calculation of a spectrogram associated with a linear frequency drift value includes prior compensation for the linear frequency drift under consideration on the total signal, and Fourier transform calculations of successive blocks of the total signal obtained after compensation.

In particular modes of implementation, the calculation of a spectrogram associated with a linear frequency drift value includes Fourier transform calculations of successive blocks of the total signal, and compensation for the linear frequency drift under consideration on the frequency spectra of the successive blocks.

In particular modes of implementation, the steps of said method are iterated for successive analysis time windows exhibiting non-zero temporal coverage.

According to a second aspect, the present invention relates to a computer program product including a set of program code instructions that, when executed by a processor, configure said processor to implement a method for detecting useful signals according to any one of the modes of implementation of the invention.

According to a third aspect, the present invention relates to a module for detecting useful signals in a total signal, including means configured to implement a method according to any one of the modes of implementation of the invention.

According to a fourth aspect, the present invention relates to a system for detecting useful signals in a total signal, including an antenna for receiving the total signal, which antenna is installed on board a spacecraft or aircraft, and including a detection module according to any one of the modes of implementation of the invention.

BRIEF DESCRIPTION OF THE DRAWINGS

The invention will be better understood on reading the following description provided by way of completely non-limiting example and with reference to the figures, which show:

FIGS. 3A-C: schematic representations of spectrograms of a total signal, which are associated with various linear frequency drift values, respectively;

In these figures, references that are the same from one figure to another denote identical or analogous elements. For the sake of clarity, the elements shown are not to scale, unless stated otherwise.

DETAILED DESCRIPTION OF EMBODIMENTS

Figure 1:
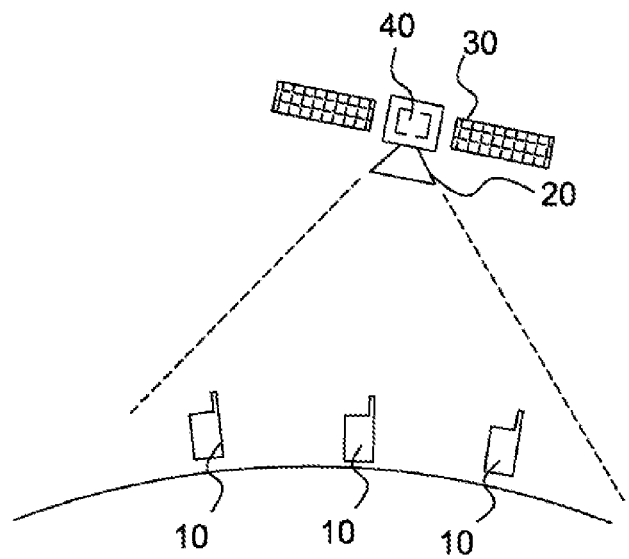
FIG. 1: a schematic representation of one exemplary embodiment of a system for detecting useful signals.

FIG. 1 schematically shows one exemplary embodiment of a system for detecting useful signals. The useful signals correspond to radiofrequency signals transmitted in a multiplexing frequency band by terminals 10 that are substantially on the surface of the Earth. The expression "substantially on the surface of the Earth" is understood to mean that each terminal 10 is on the ground (on land or at sea), or else at altitude in the Earth's atmosphere (installed on board an aircraft, a drone, a balloon, etc.).

More particularly, the useful signals must be detected in a total signal, received by a receiving station 20, which signal is representative of all of the radiofrequency signals received in the multiplexing frequency band. It should be noted that the invention is applicable to any frequency band, in particular to the frequency bands that are conventionally used in terrestrial or satellite telecommunications systems.

Throughout the rest of the description, and as illustrated by FIG. 1, it will be assumed in a non-limiting manner that the receiving station 20 is installed on board a satellite 30 in Earth orbit. However, according to other examples, there is nothing to rule out having a receiving station installed on board a spacecraft or aircraft (airplane, drone, balloon, etc.). The receiving station may also, according to other examples, be on the ground (on land or at sea).

The satellite 30 is preferably in low Earth orbit (LEO). However, nothing rules out other types of orbits being considered, for example a medium Earth orbit (MEO), a geostationary orbit (GEO), etc.

Each terminal 10 may be fixed or mobile. Similarly, the receiving station 20 may be fixed or mobile.

As mentioned above, each useful signal received by the receiving station 20 is of finite duration and may be subject to a frequency drift that is greater, over the duration of said useful signal, than a spectral width of said useful signal. The term "spectral width" of the useful signal is understood to mean the width of the instantaneous frequency spectrum of the useful signal. The frequency drift to which a useful signal is subject may be inherent to said useful signal, intentional (for example a chirp) or unintentional (for example due to low-performance frequency synthesis means), and/or independent of said useful signal and felt only at the receiving station 20 (for example due to Doppler effect, due to mobility of the terminal 10 and/or of the receiving station 20). Over the duration of said useful signal, the frequency drift perceived at the receiving station is mainly caused by the relative mobility of a terminal and only slightly by the drift of the frequency synthesis means.

The multiplexing frequency band is preferably much wider than the spectral width of each useful signal, for example at least 100 times wider than the maximum spectral width of the useful signals. The total signal, representative of the radiofrequency signals received in the multiplexing frequency band, may therefore include numerous frequency-multiplexed useful signals in said multiplexing frequency band. In addition, since the useful signals are of finite duration, the total signal may also include numerous multiplexed useful signals distributed over time. Throughout the rest of the description, it will be assumed that the following are not known a priori:
- the respective transmission times of the useful signals, for example because the terminals may transmit whenever they wish, without prior authorization, or they transmit at randomly chosen times in order to decrease the risk of collisions between useful signals, etc.;
- the respective initial frequencies of said useful signals, for example because the terminals may transmit on whatever frequency they wish within the multiplexing frequency band, or they do not perfectly control the frequency on which they transmit (for example due to low-performance frequency synthesis means), etc.

Throughout the rest of the description, it will be assumed in a non-limiting manner that the useful signals are narrow-band signals, i.e. signals the spectral width of which is equal to or less than 1 kilohertz, preferably equal to or less than 500 hertz. The invention is also applicable to other types of useful signals, however, it is understood that, for such useful signals, a frequency drift may easily become non-negligible.

As illustrated by FIG. 1, the system for detecting useful signals also includes a detection module 40.

In the non-limiting example illustrated by FIG. 1, the detection module 40 is installed on board the satellite 30. However, according to other examples, there is nothing to rule out having a detection module 40 that is remote from the satellite 30, for example at a ground station (not shown in the figures), or distributed between the satellite 30 and one or more units that are remote from said satellite 30. For redundancy purposes, the detection system may include a detection module 40 installed on board the satellite 30, and another detection module 40 at one or more ground stations.

The detection module 40 is in particular suitable for detecting useful signals in the total signal received by the receiving station 20, said total signal taking the form of a series of samples obtained after analog-to-digital conversion of an analog signal provided by said receiving station 20.

The detection module 40 includes, for example, one or more processors and storage means (magnetic hard disk, electronic memory, optical disk, etc.) in which a computer program product is stored in the form of set of program code instructions to be executed in order to implement the various steps of a method 50 for detecting useful signals in the total signal. In one variant, the detection module 40 includes one or more programmable logic circuits, of FPGA, PLD, etc. type, and/or application-specific integrated circuits (ASICs) suitable for implementing all or some of said steps of the method 50 for detecting useful signals.

Stated otherwise, the detection module 40 includes a set of software (specific computer program product) and/or hardware (FPGA, PLD, ASIC, etc.) means configured to implement the various steps of the method 50 for detecting useful signals.

Figure 2:
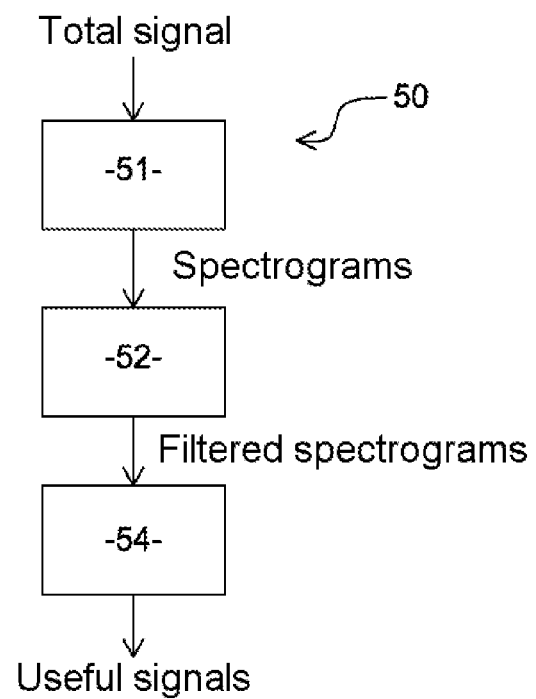
FIG. 2: a diagram showing the main steps of a method for detecting useful signals according to the invention.

FIG. 2 shows the main steps of a method 50 for detecting useful signals in the total signal, which steps are:
- a step 51 of calculating multiple spectrograms associated with various linear frequency drift values, respectively, in which the linear frequency drift for each value under consideration has been compensated for;
- for each analysis frequency and each spectrogram: a step 52 of time envelope filtering of the values at the various times of analysis of said spectrogram at said analysis frequency, by means of a filter representative of a reference time envelope of the useful signals;
- a step 54 of searching for useful signals in the spectrograms obtained by filtering, referred to below as "filtered spectrograms".

In calculation step 51, the various spectrograms are calculated from the total signal. As mentioned above, the total signal takes the form of a series of samples obtained after analog-to-digital conversion of an analog signal provided by the receiving station 20. For example, the total signal includes, in an analysis time window, a number Ne of samples x[j] ($0 \le j \le Ne-1$) separated by a predefined sampling period Te.

In order to calculate the various spectrograms, the total signal in the analysis time window under consideration is for example broken down into K successive blocks $x_k$ of N samples (K·N=Ne), respectively associated with various analysis times k within the analysis time window:

$$x_k = \{x[n+k\cdot N], 0 \le n \le N-1\}, 0 \le k \le K-1$$

The various linear frequency drift values to be considered are for example chosen so as to be regularly distributed in a predefined range of values, the limits of which are for example defined according to a priori knowledge of the maximum frequency drifts to which the various useful signals are likely to be subject (for example according to the maximum movement speeds of the terminals 10 and of the receiving station 20, according to the maximum frequency drift of the frequency synthesis means of the terminals 10, etc.). For example, linear frequency drift values am between −500 hertz per second (Hz/s) and 0 Hz/s, with a spacing of 50 Hz/s, may be considered:

$$\alpha_m \in \{-500, -450, \ldots, -50, 0\} \text{ Hz/s}$$

Each block $x_k$ of N samples then undergoes a transform into the frequency domain with compensated linear frequency drift, for each linear frequency drift value am under consideration, in order to produce a spectrogram S[m].

A spectrogram S[m] is a two-dimensional time/frequency representation of the total signal in which a linear frequency drift of value $\alpha_m$ has been compensated for. Stated otherwise, the spectrogram S[m] for the linear frequency drift value $\alpha_m$ is made up of K×N values S[k, n, m] that are respectively associated with various analysis times k ($0 \le k \le K-1$) and various analysis frequencies n ($0 \le n \le N-1$) within the multiplexing frequency band. For example the value S[k, n, m] is calculated according to the following expression:

$$S[k, n, m] = \frac{1}{N} \cdot |F(x_k, \alpha_m)[n]|^2$$

in which expression $F(x_k, \alpha_m)[n]$ corresponds to the value, at the analysis frequency n, of the transform F into the frequency domain of the block $x_k$ by compensating for a linear frequency drift of value $\alpha_m$.

Multiple expressions of the transform F into the frequency domain with compensated linear frequency drift are possible.

According to a first example, the transform $F(x_k, \alpha_m)$ into the frequency domain with compensated linear frequency drift corresponds to a fractional Fourier transform of the block $x_k$, the angle of which corresponds to the frequency drift value $\alpha_m$ under consideration:

$$F(x_k, \alpha_m)[n] = FrFT(x_k, \tan^{-1}(\alpha_m))[n]$$

where:

$$FrFT(x, \theta)[u] = \sqrt{1 - j \cdot \cot(\theta)} \cdot e^{j\pi \cdot \cot(\theta) \cdot u^2} \cdot \int_{-\infty}^{\infty} e^{-j2\pi \cdot \left(\csc(\theta) \cdot u \cdot x - \frac{\cot(\theta)}{2} \cdot x^2\right)} \cdot f(x) \cdot dx$$

in which expression:
- j is the imaginary unit ($j^2 = -1$);
- $\cot(\theta)$ is the cotangent function of the angle θ;
- $\csc(\theta)$ is the cosecant function of the angle θ;
- $e^{(y)}$ is the exponential function of the value y.

According to a second example, the transform $F(x_k, \alpha_m)$ into the frequency domain with compensated linear frequency drift includes prior compensation for the linear frequency drift of value $\alpha_m$ on the block $x_k$, and a Fourier transform calculation of the block obtained after compensation. For example compensation is carried out by multiplying the block $x_k$ by a chirp with linear frequency drift that is equal to ($-\alpha_m$), in which case, after compensation, a block $x_{k,m}$ is obtained that is equal to:

$$x_{k,m} = \{x_k[n+k\cdot N] \cdot e^{-j\pi \cdot \alpha_m \cdot (n \cdot Te + k \cdot N \cdot Te - t_0)^2}, 0 \le n \le N-1\}, 0 \le k \le K-1$$

in which expression $t_0$ corresponds to a first sampling time of the analysis time window, then the Fourier transform of the block $x_{k,m}$ is calculated:

$$F(x_k, \alpha_m)[n] = FFT(x_{k,m})[n]$$

According to a third non-limiting example, the transform $F(x_k, \alpha_m)$ into the frequency domain with compensated linear frequency drift includes a Fourier transform calculation of the block $x_k$, and frequency drift compensation on the frequency spectrum obtained for the block $x_k$, in this instance by transposition into the frequency domain:

$$F(x_k, \alpha_m)[n] = FFT(x_k)[n - \alpha_m \cdot k \cdot N^2 \cdot Te^2]$$

FIGS. 3A-C represent examples of spectrograms obtained for one and the same total signal, primarily including five useful signals $Su_1$, $Su_2$, $Su_3$, $Su_4$, and $Su_5$. More particularly:

FIG. 3A shows a spectrogram S[1] obtained for a value $\alpha_1$ that is equal to 0 Hz/s;

FIG. 3B shows a spectrogram S[2] obtained for a value $\alpha_2$ that is equal to −250 Hz/s;

FIG. 3C shows a spectrogram S[3] obtained for a value $\alpha_3$ that is equal to −450 Hz/s.

As illustrated in FIG. 3A, the useful signals $Su_1$ to $Su_5$ all exhibit a non-zero frequency bias, such that the spectrogram S[1] in principle allows no useful signal to be detected.

As illustrated in FIG. 3B, the useful signals $Su_4$ and $Su_5$ exhibit a frequency bias that is substantially linear and equal to −250 Hz/s, such that they are substantially free of frequency drift in the spectrogram S[2] and will be detectable there.

As illustrated in FIG. 3C, the useful signals $Su_1$, $Su_2$ and $Su_3$ exhibit a frequency bias that is substantially linear and equal to −450 Hz/s, such that they are substantially free of frequency drift in the spectrogram S[3] and will be detectable there.

Next, the various spectrograms S[m] are filtered in the time envelope filtering step 52. More particularly, for each spectrogram and each analysis frequency, the values at the various analysis times are filtered along the temporal axis by means of a filter representative of a reference time envelope of the useful signals. Stated otherwise, the filter used is a filter adapted to the time envelope of the useful signals.

The step 52 of time envelope filtering of the various values of the spectrogram along the temporal axis aims to improve, at each analysis time, the signal-to-noise ratio of a potential useful signal that is free of frequency drift by taking into account a priori knowledge of the time envelope of the useful signals. For example, the filter representative of the reference time envelope corresponds to a window the duration of which is equal to the duration of the useful signals, if the useful signals all have the same duration. If not all of the useful signals have the same duration and/or if they are of variable duration, then the duration of said window corresponds for example to the minimum duration of said useful signals. In the case of multiple durations being possible for the useful signals, it is also possible to consider various filters adapted to the various durations of said useful signals.

In the case of the useful signal being substantially at constant amplitude, then the time envelope filtering may consist in a simple moving sum or moving mean calculation along the temporal axis (addition/subtraction of the most/least recent value).

Figure 4:
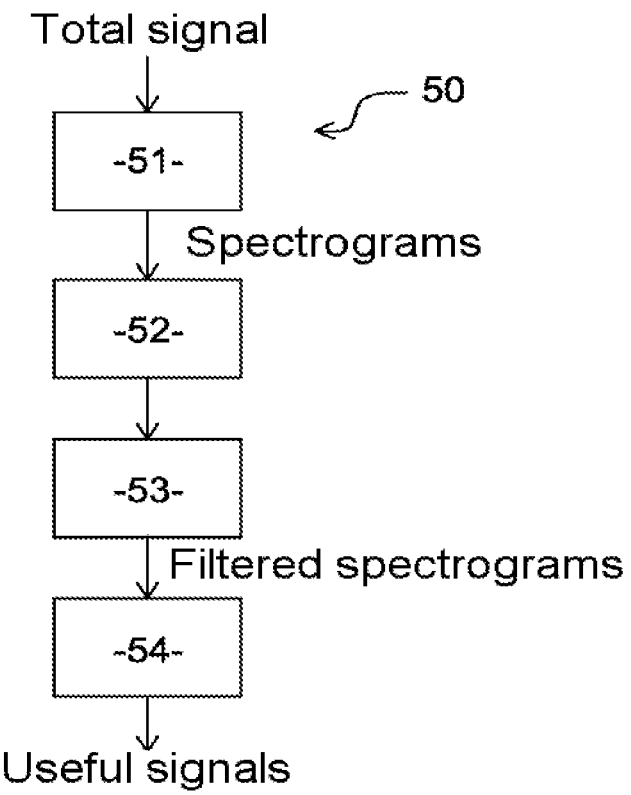
FIG. 4: a diagram showing the main steps of a detection method according to one particular mode of implementation.

FIG. 4 schematically shows one particular mode of implementation, in which the detection method 50 additionally includes a frequency spectrum filtering step 53. More particularly, for each spectrogram and each analysis time, the values at the various analysis frequencies are filtered along the frequency axis by means of a filter representative of a reference frequency spectrum of the useful signals. Stated otherwise, the filter used is a filter adapted to the frequency spectrum of the useful signals.

Like for the time envelope filtering step 52, the frequency spectrum filtering step 53 aims to improve, at each analysis frequency, the signal-to-noise ratio of a potential useful signal that is free of frequency drift. This improvement is obtained by taking into account a priori knowledge of the frequency spectrum of said useful signals, for example of the spectral width of said useful signals or the minimum spectral width of said useful signals if they do not have the same spectral width and/or if they are of variable spectral width. In the case of multiple spectral widths being possible for the useful signals, it is also possible to consider various filters adapted to the various spectral widths of said useful signals. The general form of the frequency spectrum of the useful signals may also be taken into account in the reference frequency spectrum.

Throughout the rest of the description, the case of all of the useful signals having substantially the same duration and the same frequency spectrum will be considered in a non-limiting manner. The duration of the analysis time window is chosen so as to be longer than the duration of the useful signals.

The time envelope filtering step 52 and the frequency spectrum filtering step 53 may be executed in any order. Said steps may also be executed together, for example by 2D convolution by means of a convolution kernel $K_C$ which corresponds, on the temporal axis, to a filter adapted to the time envelope of the useful signals and, on the frequency axis, to a filter adapted to the frequency spectrum of said useful signals. If necessary, the filtered spectrogram SF[m] is for example calculated according to the following expression:

$$SF[k, n, m] = \sum_u \sum_v K_C[u, v] \cdot S[k - u, n - v, m]$$

As illustrated by FIGS. 2 and 4, the detection method 50 also includes a step 54 of searching for useful signals in the filtered spectrograms SF[m] obtained by time envelope filtering and, if necessary, by frequency spectrum filtering.

In practice, a useful signal is detected at an analysis time k and an analysis frequency n if a predefined detection criterion is verified by the value SF[k, n, m] of a filtered spectrogram SF[m].

Assuming that a number M of filtered spectrograms SF[m] (1≤m≤M) are available, then this may theoretically make K×N×M values to be tested in all for a given analysis time window, if the detection criterion is evaluated for each value of each filtered spectrogram.

Figure 5:
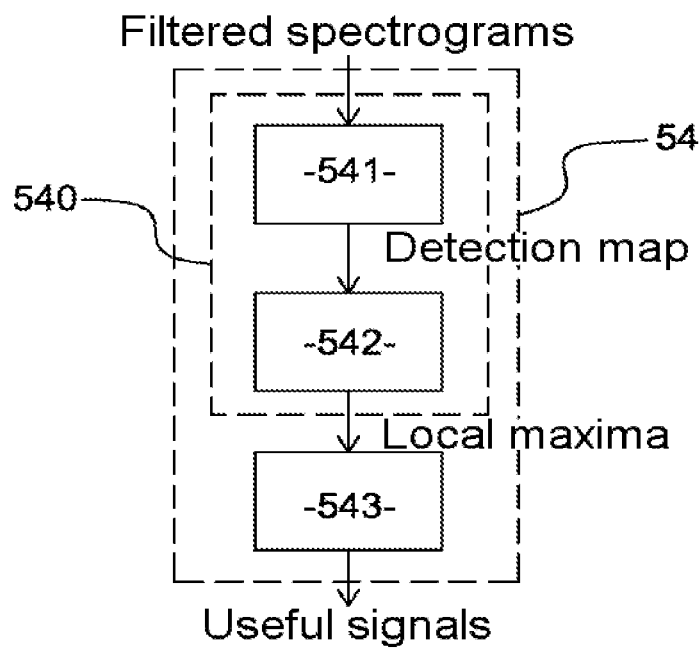
FIG. 5: a diagram showing one preferred mode of implementation of a step of searching for useful signals of the detection method.

FIG. 5 schematically represents one particular mode of implementation of the step 54 for searching for useful signals in the filtered spectrograms, in which the detection criterion is evaluated solely for values that correspond to local maxima in a set with three dimensions that is made up of the values of the various filtered spectrograms.

The step 54 for searching for useful signals includes, to this end and as illustrated by FIG. 5, a step 540 of searching for local maxima in the set with three dimensions that is made up of the values of the various filtered spectrograms, and a step 543 of evaluating the detection criterion solely for values that correspond to local maxima of said set with three dimensions.

Thus, the number of values for which the detection criterion must be evaluated is decreased. In addition, because the search for local maxima is carried out in a set with three dimensions, one and the same useful signal will correspond to a single local maximum (in the filtered spectrogram the linear frequency drift of which is closest to that of the useful signal, thereby additionally making it possible to estimate the linear frequency drift of said useful signal).

By carrying out a search for local maxima in each filtered spectrogram (i.e. by carrying out M searches for local maxima in sets with two dimensions), one and the same useful signal could correspond to multiple local maxima identified in different filtered spectrograms. As such, carrying out a search in a set with three dimensions (rather than carrying out M searches for local maxima in sets with two dimensions) make it possible to avoid multiple detections of one and the same useful signal.

However, the search for local maxima in a set with three dimensions of K×N×M values may also require substantial computing capacity.

In order to further decrease the required computing capacity, the step 540 for searching for local maxima includes, in one preferred mode of implementation that is also illustrated by FIG. 5:
- a step 541 of setting up a detection map associating, with each analysis frequency and each filtered spectrogram, the maximum value of said filtered spectrogram at said analysis frequency over the various analysis times of the analysis time window;
- a step 542 of searching for local maxima on said detection map (the detection criterion being evaluated, during step 543, for values corresponding to local maxima on said detection map).

Thus, the preferred mode of implementation illustrated by FIG. 5 is based on setting up a detection map with two dimensions on the basis of the set of K×N×M values SF[k, n, m] of a set with three dimensions.

Specifically, along the temporal axis, only the maximum values of the filtered spectrograms SF[m] in the analysis time window under consideration are retained. A transition is thus made from a set with three dimensions (time/frequency/linear frequency drift) to a set with two dimensions (frequency/linear frequency drift) in which the detection map takes, for each (analysis frequency/linear frequency drift) pair, the maximum value obtained in the analysis time window under consideration. Calculation complexity is therefore decreased by virtue of the search for local maxima being carried out in a set with two dimensions, and no longer in a set with three dimensions.

Calculation complexity is decreased by considering that it is possible to detect, for each (analysis frequency/linear frequency drift) pair, at most one useful signal in the analysis time window under consideration. In order to detect useful signals transmitted at different times for one and the same (analysis frequency/linear frequency drift) pair, the various steps of the detection method 50 may be iterated for successive analysis time windows. Preferably, the duration of the analysis time windows is chosen so as to be longer than the duration of the useful signals and shorter than double said duration of said useful signals, and they exhibit non-zero temporal overlap, in order to avoid missing a useful signal that might be straddling two analysis time windows with zero temporal overlap. For example, two adjacent analysis time windows exhibit a temporal overlap of between 10% and 50% of the duration of the analysis time windows, preferably between 20% and 40%.

The detection map $D_{2D}$ is for example determined, for an analysis time window $F_A$ including K analysis times k, according to the following expression:

$$D_{2D}[n, m] = \max_{k \in F_A}(SF[k, n, m])$$

Preferably, the analysis time $k^{max}[n, m]$ of each maximum value $D_{2D}[n, m]$ is also determined:

$$k^{MAX}[n, m] = \underset{k \in F_A}{\mathrm{argmax}}(SF[k, n, m])$$

Next, the local maxima of the detection map $D_{2D}$ are sought according to any method known to a person skilled in the art, and the detection criterion is evaluated for each local maximum of said detection map $D_{2D}$. In general, various detection criteria may be considered.

For example, the detection criterion may be verified for a local maxima of the detection map $D_{2D}$ if the value of said local maximum is higher than a predefined threshold value. Conventionally, the predefined threshold value is for example calculated according to a desired probability of false alarm and a desired probability of detection.

In order to further decrease the probability of false alarm in particular, it is also possible to consider that the detection criterion has been verified solely if the local maximum under consideration is additionally the maximum value in a predefined frequency detection window around the analysis frequency at which said local maximum has been identified. Stated otherwise, the detection criterion cannot be verified for two local maxima that are too close in terms of frequency. The width of the frequency detection window, for example centered on the analysis frequency at which the local maximum has been identified, is for example determined according to the frequency resolution of the analysis frequencies and the frequency resolution of the linear frequency drifts under consideration.

It is also possible to consider the detection criterion as being verified solely if the analysis time at which the local maximum under consideration has been identified is located in a predefined central portion of the analysis time window under consideration. Specifically, in such a case, it is ensured that all of the useful signal detected is located in the analysis time window under consideration. If the analysis time at which the local maximum under consideration has been identified is not located in said predefined central portion, and if it corresponds to a useful signal, it will always be possible to detect said useful signal in another analysis time window, by virtue of temporal overlap.

On completion of the step 543 of evaluating the detection criterion, a set of local maxima for which said detection criterion has been verified is therefore available, which local maxima are considered to correspond to useful signals detected in the total signal. The coordinates of the local maxima additionally allow a first estimate of the physical parameters of said useful signals (transmission time, initial frequency, frequency drift) to be provided. It is an object of the invention to be able to determine, for each useful signal detected, a first estimate of these parameters (transmission time, initial frequency, frequency drift), in order subsequently to be able to provide them as input to other methods that are capable of increasing the accuracy of detection at each useful signal.

More generally, it should be noted that the modes of implementation and embodiments considered above have been described by way of non-limiting examples, and that other variants can therefore be envisaged.

In particular, the invention has been described while considering a single receiving station. However, according to other examples, there is nothing to rule out considering a detection system including multiple receiving stations 20. It is then possible to achieve diversity in reception by merging, for example in a ground station, sets of total signals received and/or useful signals detected by each of the receiving stations of the detection system. This merging requires the acquisitions made by the various receiving stations to be synchronized in terms of time frequency and phase. This synchronization may be achieved using dedicated equipment (time reference), calibration signals or opportunistic useful signals received simultaneously by at least two receiving stations.

The invention claimed is:

1. A method for detecting a plurality of useful signals in a total signal, each useful signal being of a finite duration and subjectable to a frequency drift that is greater, over the duration of said each useful signal, than a spectral width of said each useful signal, the plurality of useful signals corresponding to radiofrequency signals transmitted by terminals in a multiplexing frequency band, the total signal corresponding to all of the radiofrequency signals received in the multiplexing frequency band, the method comprising:
calculating multiple spectrograms associated with linear frequency drift values, respectively, each spectrogram being representative of values of a frequency spectrum of the total signal at analysis frequencies in the multiplexing frequency band, and of time variations of the values of the frequency spectrum at analysis times within an analysis time window by compensating for a linear frequency drift under consideration;
for each analysis frequency and each spectrogram, time envelope filtering of the values of the frequency spectrum at the analysis times of said each spectrogram at said each analysis frequency, using a filter representative of a reference time envelope of the plurality useful signals; and
detecting a useful signal at an analysis time and at an analysis frequency in response to a verification of a predefined detection criterion by a filtered spectrogram for said analysis time and said analysis frequency, the filtered spectrogram being a value of a spectrogram obtained by the time envelope filtering.

2. The method as claimed in claim 1, further comprising, for each analysis time and said each spectrogram, a step of filtering the values of the frequency spectrum at the analysis frequencies of said each spectrogram at said each analysis time, using a filter representative of a reference frequency spectrum of the useful signals.

3. The method as claimed in claim 2, wherein the time envelope filtering step and the frequency spectrum filtering step are executed together.

4. The method as claimed in claim 1, further comprising a step of searching for local maxima in a set with three dimensions that is made up of the values of the filtered spectrograms, the predefined detection criterion being evaluated for values corresponding to the local maxima of said set.

5. The method as claimed in claim 4, wherein the step of searching for the local maxima comprises steps of:
setting up a detection map associating, with said each analysis frequency and each filtered spectrogram, a maximum value of said each filtered spectrogram at said analysis frequency over the analysis times of the analysis time window; and
searching for the local maxima on said detection map, the predefined detection criterion being evaluated for values corresponding to the local maxima on said detection map.

6. The method as claimed in claim 1, further comprising a step of verifying the predefined detection criterion for a value of a filtered spectrogram in response to a determination that said value is higher than a predefined threshold value.

7. The method as claimed in claim 6, wherein the step of verifying comprises verifying the predefined detection criterion for said value of said filtered spectrogram in response to a determination that said value is a maximum value over a predefined frequency detection window around said analysis frequency at which said value was obtained.

8. The method as claimed in claim 7, wherein the step of verifying comprises verifying the predefined detection criterion for said value of said filtered spectrogram in response to a determination that the analysis time at which said value was obtained is located in a predefined central portion of the analysis time window.

9. The method as claimed in claim 1, wherein the step of calculating a spectrogram associated with a linear frequency drift value comprises calculating fractional Fourier transforms of successive blocks of the total signal, an angle of which corresponds to a linear frequency drift under consideration.

10. The method as claimed in claim 1, wherein the step of calculating a spectrogram associated with a linear frequency drift value comprises a prior compensation for a linear frequency drift under consideration on the total signal, and calculating Fourier transforms of successive blocks of the total signal obtained after the compensation.

11. The method as claimed in claim 1, wherein the step of calculating a spectrogram associated with a linear frequency drift value comprises calculating Fourier transforms of successive blocks of the total signal, and compensating for a linear frequency drift under consideration on frequency spectra of the successive blocks.

12. The method as claimed in claim 1, further comprising a step iterating the steps of calculating, time envelope filtering and detecting for successive analysis time windows exhibiting a non-zero temporal coverage.

13. A computer program product recorded on a non-transitory media comprising a set of program code instructions executable by a processor to perform the steps of the method for detecting useful signals in a total signal as claimed in claim 1.

14. A detection module to detect useful signals in a total signal, comprising at least one processor and a memory configured to perform the steps of the method as claimed in claim 1.

15. A system to detect useful signals in a total signal, comprising an antenna, installed on board of a spacecraft or aircraft, to receive the total signal, and a detection module as claimed in claim 14.

16. A detection module to detect useful signals in a total signal, comprising at least one programmable logic circuit configured to perform the steps of the method as claimed in claim 1.

17. A system to detect useful signals in a total signal, comprising an antenna, installed on board of a spacecraft or aircraft, to receive the total signal, and a detection module as claimed in claim 16.

18. A detection module to detect useful signals in a total signal, comprising at least one application-specific integrated circuit configured to perform the steps of the method as claimed in claim 1.

19. A system to detect useful signals in a total signal, comprising an antenna, installed on board of a spacecraft or aircraft, to receive the total signal, and a detection module as claimed in claim 18.

* * * * *